(12) United States Patent
Ueda et al.

(10) Patent No.: US 10,062,820 B2
(45) Date of Patent: Aug. 28, 2018

(54) INTERPOSER

(71) Applicant: PANASONIC INTELLECTUAL PROPERTY MANAGEMENT CO., LTD., Osaka (JP)

(72) Inventors: Mituhiko Ueda, Osaka (JP); Makoto Saito, Osaka, PA (US); Takanori Aketa, Osaka (JP); Toru Hirano, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/573,088

(22) PCT Filed: Apr. 26, 2016

(86) PCT No.: PCT/JP2016/002196
§ 371 (c)(1),
(2) Date: Nov. 9, 2017

(87) PCT Pub. No.: WO2016/185675
PCT Pub. Date: Nov. 24, 2016

(65) Prior Publication Data
US 2018/0166617 A1 Jun. 14, 2018

(30) Foreign Application Priority Data
May 15, 2015 (JP) .................. 2015-100173

(51) Int. Cl.
*H01L 33/00* (2010.01)
*H01L 33/62* (2010.01)
(Continued)

(52) U.S. Cl.
CPC ............ *H01L 33/62* (2013.01); *H01L 23/147* (2013.01); *H01L 24/42* (2013.01); *H01L 33/44* (2013.01);
(Continued)

(58) Field of Classification Search
CPC . H01L 2224/48465; H01L 2224/48624; H01L 2224/73265; H01L 33/60; H01L 33/62; H01L 33/44
See application file for complete search history.

(56) References Cited

U.S. PATENT DOCUMENTS

2005/0104220 A1* 5/2005 Tsuchiya ................. H01L 24/10
257/774
2006/0054910 A1 3/2006 Takemori et al.
(Continued)

FOREIGN PATENT DOCUMENTS

JP 2005-057120 A 3/2005
JP 2005-150386 A 6/2005
(Continued)

OTHER PUBLICATIONS

International Search Report and Written Opinion issued International Patent Application No. PCT/JP2016/002196, dated Jul. 12, 2016; with partial English translation.
(Continued)

*Primary Examiner* — Jaehwan Oh
*Assistant Examiner* — John M Parker
(74) *Attorney, Agent, or Firm* — McDermott Will & Emery LLP

(57) ABSTRACT

An interposer includes element mounting sections and terminal sections directly and partly formed on a surface of an aluminum film having the predetermined pattern. Each of the element mounting sections and the terminal sections has a laminated structure of an Ni film, an Pd film and an Au film. The interposer is formed with an AuSn layer on a predetermined region of a surface of each Au film in the element mounting sections. The interposer includes a protective film having optical permeability that directly covers a region of the surface of the aluminum film, which is out of
(Continued)

contact with the element mounting sections and the terminal sections.

16 Claims, 13 Drawing Sheets

(51) Int. Cl.
    *H01L 23/14*     (2006.01)
    *H01L 33/60*     (2010.01)
    *H01L 23/00*     (2006.01)
    *H01L 33/44*     (2010.01)

(52) U.S. Cl.
    CPC .... *H01L 33/60* (2013.01); *H01L 2224/16145* (2013.01); *H01L 2224/48091* (2013.01); *H01L 2224/73265* (2013.01)

(56) References Cited

U.S. PATENT DOCUMENTS

| | | | |
|---|---|---|---|
| 2010/0051995 A1* | 3/2010 | Katsuno | H01L 33/44 257/98 |
| 2010/0117114 A1* | 5/2010 | Suzuki | H01L 33/38 257/99 |
| 2012/0205789 A1 | 8/2012 | Natsuaki et al. | |
| 2013/0188361 A1 | 7/2013 | Muramatsu et al. | |
| 2014/0299963 A1 | 10/2014 | Tenailleau et al. | |
| 2016/0020374 A1* | 1/2016 | Aketa | H01L 33/62 257/91 |
| 2016/0111616 A1* | 4/2016 | Margalit | H01L 33/62 257/98 |
| 2016/0218262 A1 | 7/2016 | Aketa et al. | |

FOREIGN PATENT DOCUMENTS

| | | |
|---|---|---|
| JP | 2006-086176 A | 3/2006 |
| JP | 2008-098296 A | 4/2008 |
| JP | 2009-177098 A | 8/2009 |
| JP | 2011-151339 A | 8/2011 |
| JP | 2012-069691 A | 4/2012 |
| JP | 2012-169440 A | 9/2012 |
| JP | 2013-153069 A | 8/2013 |
| JP | 2014-179385 A | 9/2014 |
| JP | 2014-183237 A | 9/2014 |
| JP | 2015-503239 A | 1/2015 |
| WO | 2014/141691 A1 | 9/2014 |
| WO | 2015/033557 A1 | 3/2015 |

OTHER PUBLICATIONS

Office Action issued in Japanese Application No. 2017-518742 dated May 1, 2018 (with English translation).

\* cited by examiner

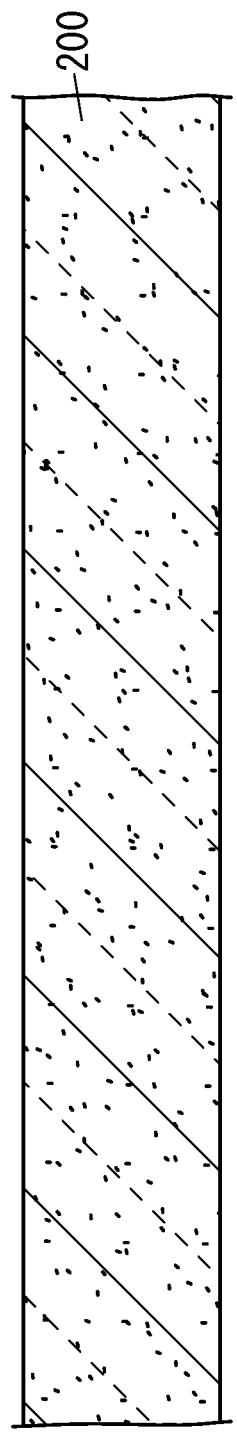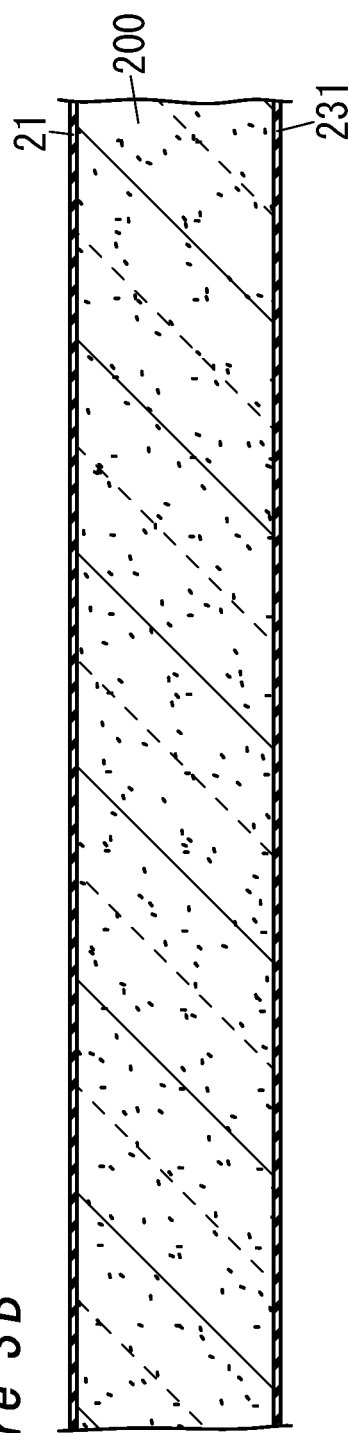

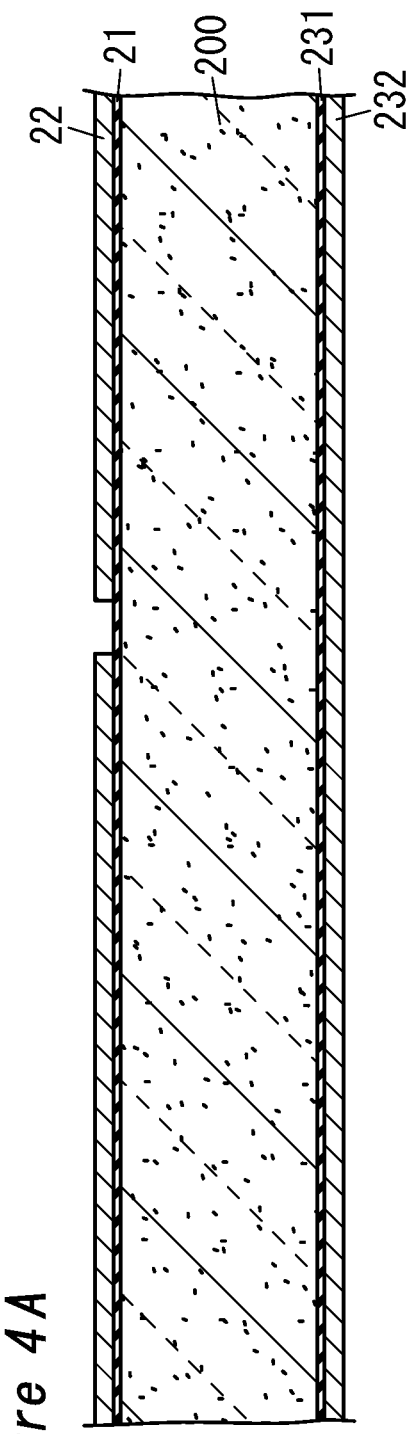
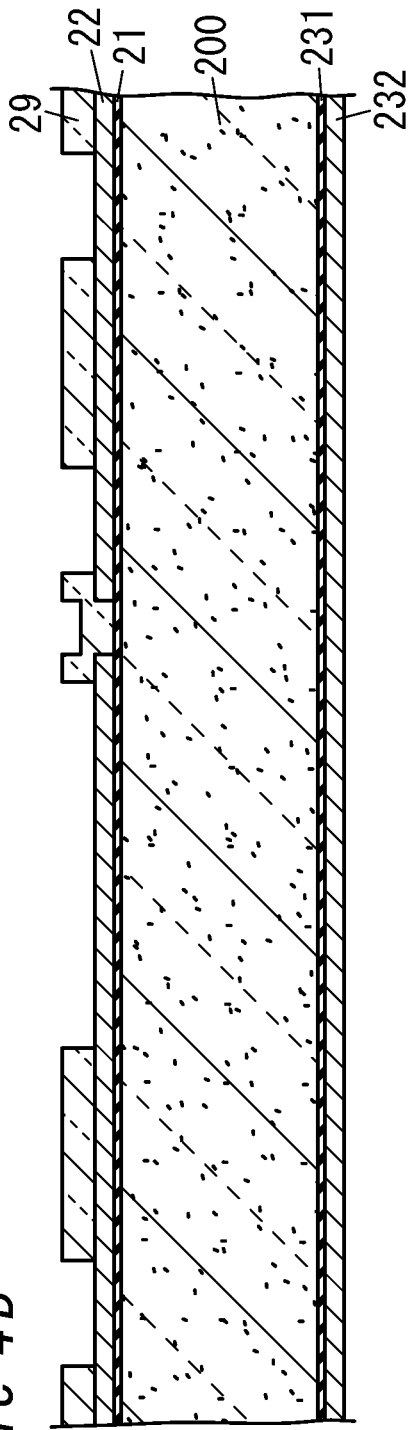
Figure 4A
Figure 4B

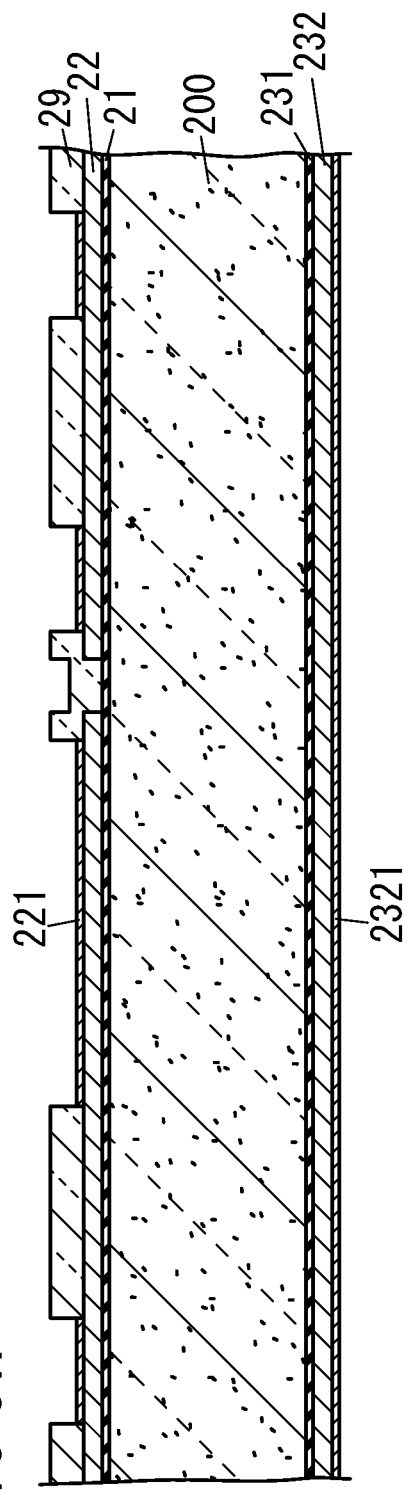
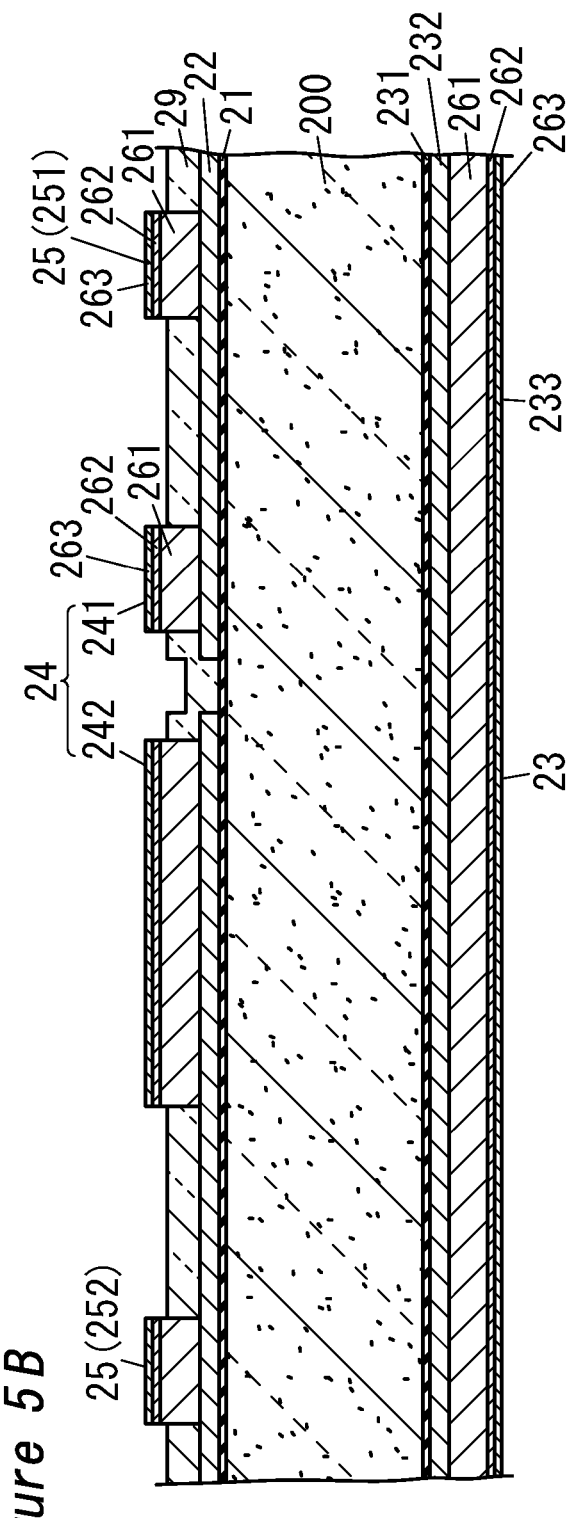

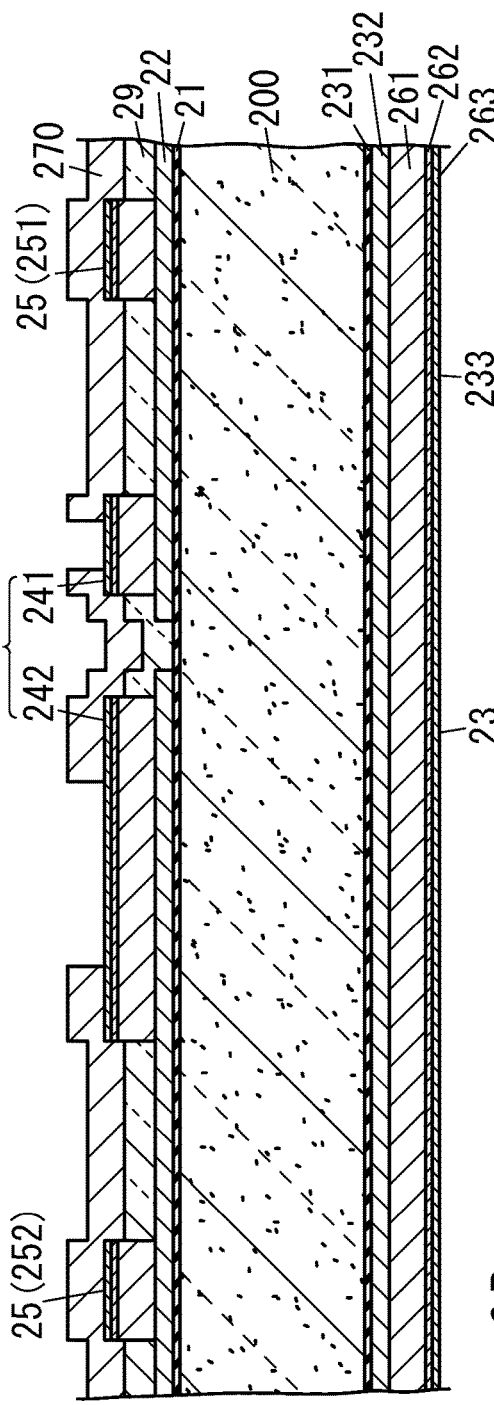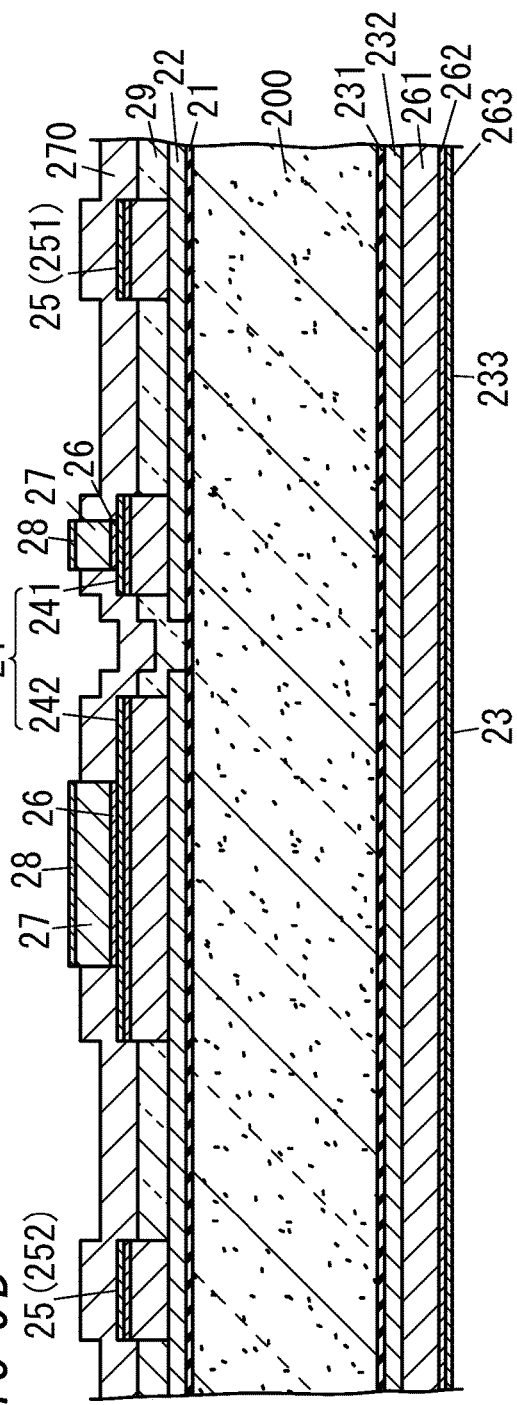

ID
INTERPOSER

RELATED APPLICATIONS

This application is the U.S. National Phase under 35 U.S.C. § 371 of International Patent Application No. PCT/JP2016/002196, filed on Apr. 26, 2016, which in turn claims the benefit of Japanese Application No. 2015-100173, filed on May 15, 2015, the entire disclosures of which Applications are incorporated by reference herein.

TECHNICAL FIELD

The invention relates to interposers and, more particularly, to an interposer to be interposed between a light emitting element and a circuit board.

BACKGROUND ART

As sort of this interposer, there has been known a conventional wiring board which a light emitting element (LED chip) is mounted on and which has a high reflectivity (Patent Literature 1).

In the wiring board described in Patent Literature 1, gold films form a pattern by plating on an upper surface of a ceramic substrate.

The gold films are provided with an anode electrode and a cathode electrode that are connected to a circuit outside the wiring board without short-circuiting.

The wiring board is formed with a silver film, around a mounting section, on the gold films and almost all of a substrate surface which is the upper surface of the ceramic substrate and which the gold films are not formed on. A dielectric multilayer film is formed on the silver film.

In the wiring board, platinum films are under the gold films, and titanium films are under the platinum films and in contact with the ceramic substrate.

In a light emitting device with the wiring board, an LED chip is joined to the wiring board through alloy of gold and tin by flip-chip assembly.

What is desired in the field of interposers to be interposed between a light emitting element and a circuit board is cost reduction.

CITATION LIST

Patent Literature

Patent Literature 1: JP 2011-151339 A

SUMMARY OF INVENTION

It is an object of the present invention to provide an interposer enabling cost reduction.

An interposer according to an aspect of the present invention includes a silicon substrate, a silicon oxide film that is directly formed on a surface of the silicon substrate, an aluminum film having a predetermined pattern, which is directly formed on a surface of the silicon oxide film, a fixed portion that is formed on a back surface of the silicon substrate in order to fix the silicon substrate to a circuit board, element mounting sections for a light emitting element, which is directly and partly formed on a surface of the aluminum film having the predetermined pattern, and terminal sections that are directly and partly formed on the surface of the aluminum film having the predetermined pattern. Each of the element mounting sections and the terminal sections has a laminated structure of an Ni film, a Pd film and an Au film or a laminated structure of an Ni film and an Au film. The interposer is formed with an AuSn layer on a predetermined region of a surface of the Au film in each of the element mounting sections. The surface of the aluminum film having the predetermined pattern forms, around each of the element mounting sections, a reflecting surface that reflects light. The interposer includes a protective film that has optical permeability and directly covers a region of the surface of the aluminum film having the predetermined pattern. The region of the surface of the aluminum film is out of contact with the element mounting sections and the terminal sections.

BRIEF DESCRIPTION OF DRAWINGS

FIGS. 3A and 3B are sectional views of illustrating processes in an interposer production method thereof;

FIGS. 4A and 4B are sectional views of illustrating processes in the interposer production method;

FIGS. 5A and 5B are sectional views of illustrating processes in the interposer production method;

FIGS. 6A and 6B are sectional views of illustrating processes in the interposer production method;

DESCRIPTION OF EMBODIMENTS

Each figure to be explained in the following Embodiments 1 and 2 is a schematic diagram, and ratios about respective thickness and dimensions among components in the figures do not necessarily represent actual dimensional ratios.

Embodiment 1

Hereinafter, an interposer 2a according to the present embodiment will be explained with reference to FIGS. 1 and 2.

Figure 2:
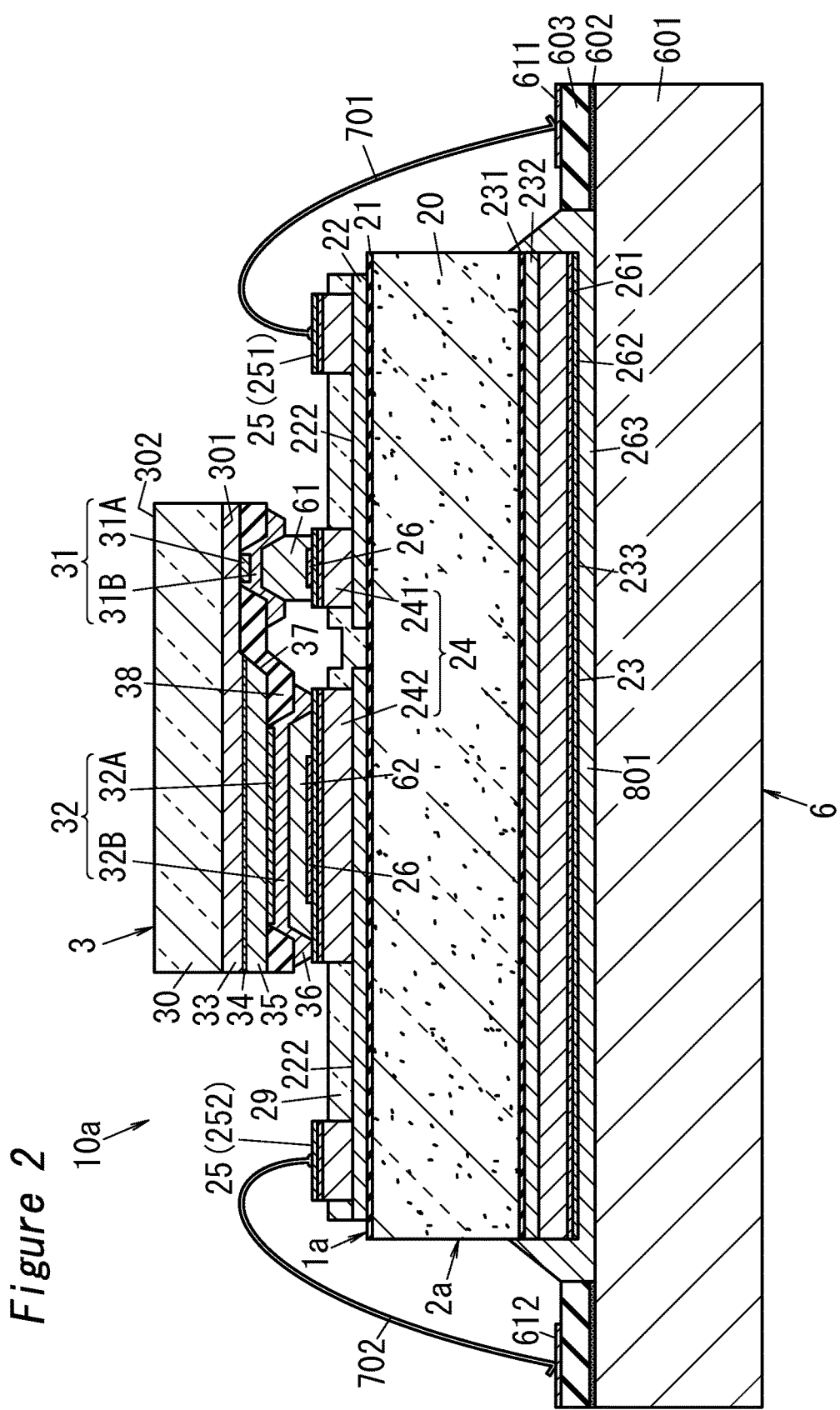
FIG. 2 is a schematic sectional view of an LED module with the interposer.

As shown in FIG. 2, the interposer 2a is a mounting substrate which a light emitting element 3 is mounted on and which is fixed to a circuit board 6. In other words, the interposer 2a is an intermediate substrate to be interposed between the light emitting element 3 and the circuit board 6 to electrically connect the light emitting element 3 and the circuit board 6.

Figure 1:
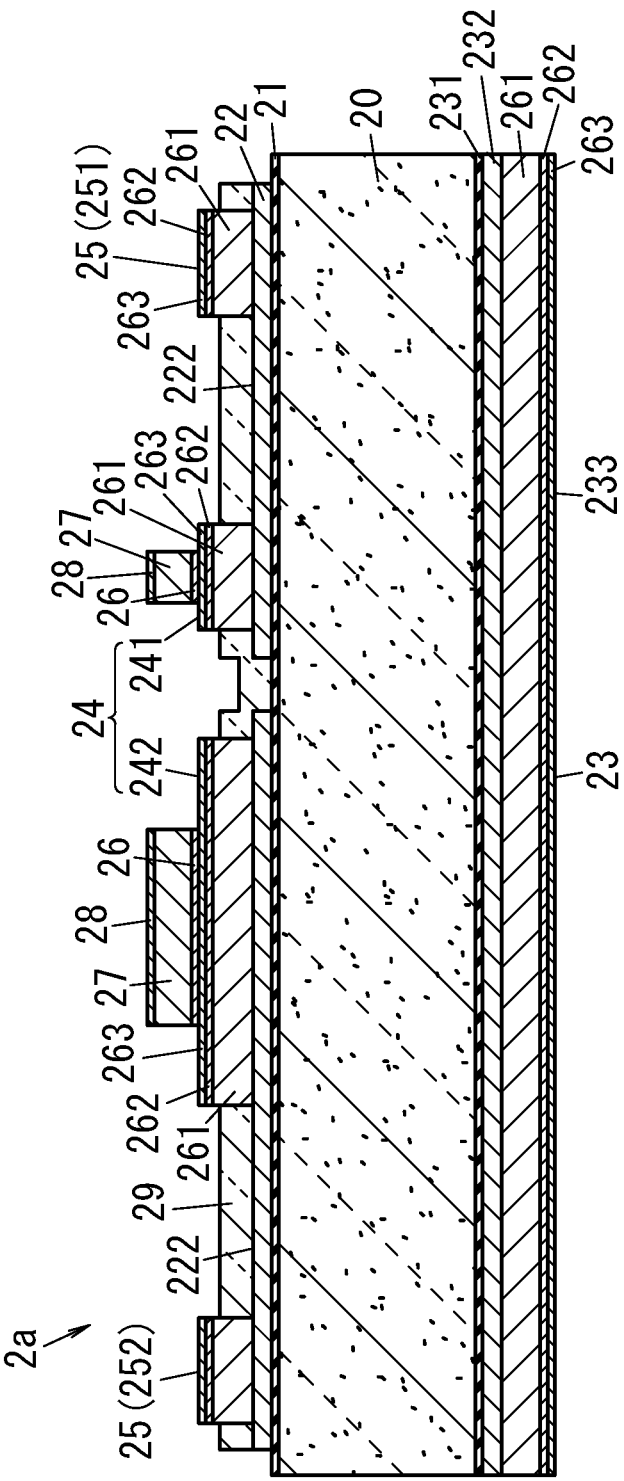
FIG. 1 is a schematic sectional view of an interposer in accordance with Embodiment 1 of the present invention.

As shown in FIG. 1, the interposer 2a includes a silicon substrate 20, a silicon oxide film 21 that is directly formed on a surface of the silicon substrate 20, and an aluminum film 22 having a predetermined pattern, which is directly formed on a surface of the silicon oxide film 21. The interposer 2a includes a fixed portion 23 that is formed on a back surface of the silicon substrate 20. The fixed portion 23 is formed to fix the silicon substrate 20 to the circuit board 6 (see FIG. 2). The interposer 2a includes element mounting sections 24 for the light emitting element 3 (see FIG. 2), which are directly and partly formed on a surface of the aluminum film 22 having the predetermined pattern, and terminal sections 25 that are directly and partly formed on the surface of the aluminum film 22 having the predetermined pattern. Each of the element mounting sections 24 and the terminal sections 25 has a laminated structure of an Ni film 261, a Pd film 262 and an Au film 263. In the interposer 2a, an AuSn layer 27 is formed on a predetermined region of a surface of the Au film 263 in each of the element mounting sections 24. The surface of the aluminum film 22 having the predetermined pattern forms, around each of the element mounting sections 24, a reflecting surface 222 that reflects light. The interposer 2a includes a protective film 29 that has optical permeability. The protective film 29 directly covers a region of the surface of the aluminum film 22 having the predetermined pattern, which is out of contact with the element mounting sections 24 and the terminal sections 25. The Ni film 261, the Pd film 262 and the Au film 263 are arranged in that order from a side of the surface of the aluminum film 22 having the predetermined pattern in the element mounting sections 24 and the terminal sections 25. The interposer 2a having the structure as explained above enables cost reduction. Specifically, the element mounting sections 24 and the terminal sections 25 are formed by electroless plating. That is, the Ni film 261, the Pd film 262 and the Au film 263 are each formed by electroless plating. The AuSn layer 27 is formed by electroplating. With the interposer 2a, the surface of the aluminum film 22 having the predetermined pattern forms, around each of the element mounting sections 24, the reflecting surface 222 that reflects light, and is directly covered with the protective film 29 that has optical permeability. It is therefore possible to increase the reflectivity and suppress the change with time of the reflectivity. The aluminum film 22 having the predetermined pattern in the interposer 2a has a function as a wiring layer for electrically connecting the light emitting element 3 and the circuit board 6, and a function as a reflection film for reflecting light from the light emitting element 3. Moreover, in the interposer 2a, the laminated structure of the Ni film 261, the Pd film 262 and the Au film 263 is provided for the element mounting sections 24 and the terminal sections 25. It is therefore possible to reduce an amount of Au used for the Au film 263 and achieve cost reduction while employing the structure which can join (bond) the light emitting element 3 to the element mounting sections 24 by AuSn.

Hereinafter, an LED module 10a with the interposer 2a will be explained with reference to FIG. 2 before describing the interposer 2a in detail.

The LED module 10a includes the interposer 2a, the light emitting element 3 mounted on the interposer 2a, and the circuit board 6 which the interposer 2a is mounted on.

The light emitting element 3 is an LED chip such as, for example a ultraviolet LED chip configured to emit ultraviolet radiation having a peak emission wavelength in a ultraviolet wavelength band. The ultraviolet LED chip is an AlGaN-based ultraviolet LED chip having a peak emission wavelength in a UV-C wavelength band. Accordingly, the LED module 10a can preferably be used for, for example sterilization. According to the classification of ultraviolet wavelength by, for example the International Commission on Illumination (CIE), the "UV-C wavelength band" is a 100 nm to 280 nm band. When the LED module 10a is used for the application of sterilization, it is preferable that the light emitting element 3 emit ultraviolet radiation having a peak emission wavelength in a wavelength band of 240 nm to 280 nm.

In the present specification, a module in which a light emitting device 1a including the interposer 2a and the light emitting element 3 mounted on the interposer 2a is mounted on the circuit board 6 is called the LED module 10a.

As shown in FIG. 2, the light emitting element 3 includes a substrate 30. The substrate 30 has a first surface 301 and a second surface 302. The light emitting element 3 is formed with a first conductive type semiconductor layer 33, a luminous layer 34 and a second conductive type semiconductor layer 35 in order apart from the first surface 301 on a side of the first surface 301 of the substrate 30.

Preferably, examples of the substrate 30 in the light emitting element 3 include a sapphire substrate, a single crystal AN substrate and the like. The substrate 30 is preferably transparent with respect to the ultraviolet radiation (light) emitted from the luminous layer 34. The light emitting element 3 preferably includes a buffer layer between the substrate 30 and the first conductive type semiconductor layer 33. The luminous layer 34 preferably has multiple quantum well structure.

The light emitting element 3 has mesa structure 37, and a first electrode 31 is formed on an exposed surface of the first conductive type semiconductor layer 33 while a second electrode 32 is formed on a surface of the second conductive type semiconductor layer 35. The first and second electrodes 31 and 32 are arranged on one side in a thickness direction of the light emitting element 3. In the light emitting element 3, the first conductive type semiconductor layer 33 is an n-type semiconductor layer, and the second conductive type semiconductor layer 35 is a p-type semiconductor layer. Here, the first electrode 31 and the second electrode 32 in the light emitting element 3 are a negative electrode and a positive electrode, respectively.

In the light emitting element 3, an area of the surface of the second conductive type semiconductor layer 35 is larger than an area of the exposed surface of the first conductive type semiconductor layer 33.

The light emitting element 3 includes an insulation film 38. The insulation film 38 is electrically non-conductive. The insulation film 38 is formed on the surface of the second conductive type semiconductor layer 35 so as to surround a region of the second electrode 32, contacted with the second conductive type semiconductor layer 35. The second electrode 32 in the light emitting element 3 is formed from the surface of the second conductive type semiconductor layer 35 to a surface of the insulation film 38. In the light emitting element 3, an outer periphery of the second electrode 32, protruding from a central part thereof in a direction apart from the second conductive type semiconductor layer 35 forms a projection structure 36. In the light emitting element 3, the second electrode 32 is preferably larger than the first electrode 31. The projection structure 36 in the light emitting element 3 is preferably formed on all the outer periphery of the second electrode 32. The projection structure 36 of the light emitting element 3 in the light emitting device 1a is in contact with a corresponding surface of the element mounting sections 24 of the interposer 2a.

A second joining part 62 in the light emitting device 1a is preferably formed to fill a space enclosed with the second electrode 32, the projection structure 36 and a second conductor 242.

The first electrode 31 of the light emitting element 3 includes a first ohmic electrode layer 31A and a first pad electrode layer 31B.

The first ohmic electrode layer 31A is formed on a surface of the first conductive type semiconductor layer 33 in order to acquire ohmic contact with the first conductive type semiconductor layer 33. The first pad electrode layer 31B is formed to cover the first ohmic electrode layer 31A. The first pad electrode layer 31B is formed of a laminated film of a Ti film and an Au film.

The second electrode 32 of the light emitting element 3 includes a second ohmic electrode layer 32A and a second pad electrode layer 32B.

The second ohmic electrode layer 32A is formed on the surface of the second conductive type semiconductor layer 35 in order to acquire ohmic contact with the second conductive type semiconductor layer 35. The second pad electrode layer 32B is formed to cover the second ohmic electrode layer 32A. The second pad electrode layer 32B is formed of a laminated film of a Ti film and an Au film.

The second pad electrode layer 32B is formed from a surface of the second ohmic electrode layer 32A to the surface of the insulation film 38.

The circuit board 6 is, for example a metal-based printed wiring board. In this case, the circuit board 6 preferably includes, for example, a metal plate 601, an insulating resin layer 603 formed on the metal plate 601 through an adhesion layer 602, and a first wiring part 611 and a second wiring part 612 that are formed on the insulating resin layer 603. The metal plate 601 is composed of, but not limited to, a Cu plate, but may be composed of, for example an Al plate. Each of the first and second wiring parts 611 and 612 has a laminated structure of a Cu foil, an Ni film and an Au film. The circuit board 6 is larger than the interposer 2a in a plan view seen from a direction along a thickness direction of the circuit board 6. The circuit board 6 exposes a region slightly larger than a projection region of the interposer 2a in a surface of the metal plate 601.

In the LED module 10a, the fixed portion 23 on a back surface of the interposer 2a is joined on the metal plate 601 through a joining layer 801. The joining layer 801 is composed of, but not limited to, solder but may be composed of, for example sintered silver. The sintered silver is a sintered object formed by sintering silver particles. The sintered silver is porous silver. When the joining layer 801 is composed of the sintered silver, the sintered silver is required to be formed by applying a paste containing silver particles, volatile binder and solution on the surface of the metal plate 601, then laying the light emitting device 1a on the metal plate 601 through the paste, and then heating the paste.

A terminal section 25 (first terminal section 251) of the interposer 2a in the LED module 10a is electrically connected to the first wiring part 611 through a first wire 701. A terminal section 25 (second terminal section 251) of the interposer 2a in the LED module 10a is also electrically connected to the second wiring part 612 through a second wire 702. Each of the first and second wires 701 and 702 is preferably an Au wire.

The interposer 2a will hereinafter be explained in detail.

As an example, the interposer 2a is configured to allow one light emitting element 3 to be mounted on. The "mounted" term represents a concept including the arrangement, mechanical connection and electrical connection of the light emitting element 3.

The interposer 2a is larger than the light emitting element 3 in a plan view. In other words, the interposer 2a is larger than the light emitting element 3 as seen from a thickness direction of the interposer 2a.

The silicon substrate 20 is a single crystal silicon substrate. The surface of the silicon substrate 20 is preferably a (100) plane. The silicon substrate 20 has a function for supporting the element mounting sections 24 and the terminal sections 25. The silicon substrate 20 also has a function as a heat sink for efficiently transmitting the heat generated by the light emitting element 3 outward.

The silicon substrate 20 is flat in shape. An outer periphery of the silicon substrate 20 is rectangular in shape (quadrilateral with four right angles).

The silicon oxide film 21 is an electrical insulating film. The silicon oxide film 21 is preferably a thermal oxide film. The silicon oxide film 21 has a function for electrically insulating the element mounting sections 24 from the silicon substrate 20. Preferably, thickness of the silicon oxide film 21 is set to, for example suppress the dielectric breakdown of the light emitting element 3 by static electricity. The silicon oxide film 21 is, for example 0.5 μm in thickness.

The aluminum film 22 having the predetermined pattern is made of Al, and is electrically conductive and light reflective. The aluminum film 22 having the predetermined pattern has a function as a wiring layer for electrically connecting the light emitting element 3 and the circuit board 6, and a function as a reflecting layer for reflecting ultraviolet radiation emitted from the light emitting element 3. The wiring layer in the interposer 2a is made of Al, and it is therefore possible to achieve cost reduction as compared with cases where the wiring layer is made of Au. The aluminum film 22 having the predetermined pattern preferably has thickness that is preferably set to acquire a desired light reflectivity and resistance to zincate treatment. The zincate treatment is pretreatment when the element mounting sections 24 and the terminal sections 25 are formed on the surface of the aluminum film 22 having the predetermined pattern by electroless plating. The zincate treatment includes soaking a treated object including the silicon substrate 20, the silicon oxide film 21 and the aluminum film 22 having the predetermined pattern in a zincate solution, and forming zinc on a predetermined exposed region of the surface of the aluminum film 22 having the predetermined pattern by substitution precipitation. The zincate solution contains NaOH and ZnO. The aluminum film 22 having the predetermined pattern is, for example 1.5 μm in thickness.

The element mounting sections 24 are conductors which the light emitting element 3 is mounted on by flip-chip assembly. In other words, the element mounting sections 24 are light emitting element mounting sections which the light emitting element 3 is mounted on with no wire. The element mounting sections 24 are composed of a first conductor 241 and the second conductor 242. The first electrode 31 of the light emitting element 3 is joined to the first conductor 241 through a first joining part 61 (see FIG. 2). The second electrode 32 of the light emitting element 3 is joined to the second conductor 242 through the second joining part 62 (see FIG. 2). Each of the first and second joining parts 61 and 62 is made of AuSn. In short, the element mounting sections 24 include the first and second conductors 241 and 242 configured to be electrically connected with the light emitting element 3. The first conductor 241 is a conductive layer to be electrically connected with the first electrode 31 of the light emitting element 3. The second conductor 242 is a conductive layer to be electrically connected with the second electrode 32 of the light emitting element 3. The first and second conductors 241 and 242 in the interposer 2a are arranged so that the first and second conductors 241 and 242 are separated with a space therebetween. Thus, the first and second conductors 241 and 242 in the interposer 2a are electrically insulated.

The terminal sections 25 are separated from each other. The terminal sections 25 are also arranged apart from the element mounting sections 24. Specifically, in the interposer 2a, the element mounting sections 24 is partly disposed on a central part of the surface of the silicon oxide film 21 while the terminal sections 25 are partly arranged on a periphery of the surface of the silicon oxide film 21. The terminal sections 25 include the first terminal section 251 electrically connected to the first conductor 241, and the second terminal section 252 electrically connected to the second conductor 242.

The aluminum film 22 having the predetermined pattern is formed apart from an outer peripheral edge of the surface of the silicon oxide film 21. The interposer 2a accordingly enables preventing the aluminum film 22 having the predetermined pattern from being pulled by a dicing saw to touch the silicon substrate 20 when being diced in the production thereof, thereby improving the manufacturing yield. In the surface of the silicon oxide film 21, preferably a distance from the outer peripheral edge of the silicon oxide film 21 to the aluminum film 22 having the predetermined pattern is, for example about 0.05 mm to 1 mm.

The first joining part 61 in the light emitting device 1a is formed by using the AuSn layer 27 on the predetermined region of the surface of the Au film 263 in the first conductor 241. The second joining part 62 in the light emitting device 1a is formed by using the AuSn layer 27 on the predetermined region of the surface of the Au film 263 in the second conductor 242.

The AuSn layer 27 has thickness that is set to be larger by predetermined thickness (e.g., 1 μm) than a total of a protrusion length of the projection structure 36 in the light emitting element 3 (e.g., 1 μm) and a height of a step between the first and second electrodes 31 and 32 in the thickness direction of the light emitting element 3 (e.g., 1 μm). That is, the thickness of the AuSn layer 27 is set to be 3 μm as one example. The "protrusion length of the projection structure 36" is a dimension between a plane containing a surface of a central part of the second electrode 32 and a plane containing an end face of the projection structure 36. The "height of a step between the first and second electrodes 31 and 32 in the thickness direction of the light emitting element 3" is a dimension between a plane containing a surface of a central part of the first electrode 31 and the plane containing the surface of the central part of the second electrode 32.

Here, each of the element mounting sections 24 and the terminal sections 25 has a laminated structure of an Ni film 261, a Pd film 262 and an Au film 263 as stated above. That is, in the interposer 2a, the laminated structures of the element mounting sections 24 are the same as those of the terminal sections 25. Specifically, in the interposer 2a, each of the laminated structures of the first and second conductors 241 and 242 is the same as each of the laminated structures of the terminal sections 25.

Each laminated structure of the first and second conductors 241 and 242 and the terminal sections 25 in the interposer 2a is formed of identical material and has identical thickness. It is accordingly possible to form the first and second conductors 241 and 242 and the terminal sections 25 in the interposer 2a at the same time in production thereof. The interposer 2a is also formed so that a surface of the first conductor 241 is flushed with a surface of the second conductor 242.

The Ni film 261 is, for example 2 μm in thickness. With the interposer 2a, if the Ni film 261 is greater than 2 μm in thickness, the coverage of the step tends to fall when a resist layer is formed to cover regions except for a predetermined region on a side of the surface of the silicon substrate 20 in production of the interposer 2a. With the interposer 2a, if the Ni film 261 is less than 2 μm in thickness, the thickness of the Ni film 261 formed by electroless plating in production thereof tends to have large dispersion.

The Pd film 262 is, for example 0.1 μm to 0.2 μm in thickness. The Pd film 262 is required to have thickness capable of securing barrier property between the Ni film 261 and the Au film 263. That is, the thickness of the Pd film 262 is required to contribute to the suppression of diffusion of respective elements constituting the Ni film 261 and the Au film 263 (Ni, Au) between them. The presence of the diffusion of respective elements constituting can be evaluated by, for example SIMS (Secondary Ion Mass Spectroscopy) or the like.

The Au film 263 is, for example 0.1 μm in thickness. Preferably, the thickness of the Au film 263 is thinner as long as the thickness enables bonding of an Au wire on the terminal sections 25.

Preferably, the interposer 2a further includes Pt layers 26 between the AuSn layers 27 and the predetermined regions of the surfaces of the Au films 263 in the element mounting sections 24. The interposer 2a accordingly enables suppressing the diffusion of Sn and Au between the AuSn layers 27 and the Au films 263 when the AuSn layers 27 are melted, thereby stabilizing the composition of AuSn. In short, the Pt layer 26 between the Au film 263 and the AuSn layer 27 in the first conductor 241 as well as the Pt layer 26 between the Au film 263 and the AuSn layer 27 in the second conductor 242 have respective functions as barrier layers for suppressing the diffusion of Sn and Au. The light emitting device 1a accordingly enables stabilizing the composition of AuSn in each of the first and second joining parts 61 and 62. The Pt layer 26 is, for example 0.2 μm in thickness. In the present specification, the "AuSn layer 27 is formed on a predetermined region of a surface of the Au film 263" means the AuSn layer 27 being directly formed on the surface of the Au film 263, the AuSn layer 27 being formed on the surface of the Au film 263 through the AuSn layer 27, or the like.

The interposer 2a preferably includes respective Au layers 28 directly formed on the AuSn layers 27. The interposer 2a accordingly enables suppressing the oxidation of the AuSn layers 27. The interposer 2a therefore enables improving the joining performance between the interposer 2a and the light emitting element 3. The joining performance can be evaluated by, for example die shear strength. The die shear strength is strength required to peel the light emitting element 3 joined on the interposer 2a, along a direction parallel to the joining interface. The die shear strength can be measured with, for example a die shear tester or the like. The Au layer 28 is, for example 0.05 μm to 0.1 μm in thickness.

Preferably, in AuSn composition of the AuSn layer 27, a composition ratio of Au thereof is smaller than that of eutectic composition (70 at % Au, 30 at % Sn), and the composition thereof (e.g., 60 at % Au, 40 at % Sn) allows the AuSn layer to be melted at the temperature that is, for example, greater than or equal to 300° C. and less than 400°

C. The composition of the AuSn layer 27 is preferably set to be eutectic composition as a result of Au being added from regions except for the AuSn layers 27 when the AuSn layers 27 are melted in a process of mounting the light emitting element 3 on the interposer 2a.

For example, in the optical permeability of the protective film 29, transmittance with respect to the ultraviolet radiation (light) from the light emitting element 3 is, preferably greater than or equal to 70%, more preferably greater than or equal to 80%, or further more preferably greater than or equal to 90%.

The protective film 29 is preferably made of silicon oxide. The interposer 2a can accordingly secure the protective film 29 being electrically non-conductive, and the optical permeability thereof. The protective film 29 preferably has thickness that is set to acquire the abovementioned resistance to zincate treatment and desired optical permeability. For example, the thickness of the protective film 29 is preferably greater than or equal to 0.3 µm and less than or equal to 1 µm, and as one example 0.5 µm.

The fixed portion 23 preferably includes a silicon oxide film 231 directly formed on the back surface of the silicon substrate 20, an aluminum film 232 directly formed on a surface of the silicon oxide film 231 on the back surface of the silicon substrate 20, and a plating layer 233 formed on a surface of the aluminum film 232. The plating layer 233 preferably has a laminated structure that is the same as those of the element mounting sections 24 and the terminal sections 25. The interposer 2a accordingly enables simplifying a production process in production thereof and cost reduction. The interposer 2a can also efficiently transfer heat, which is generated by the light emitting element 3 and transmitted to the interposer 2a, from the light emitting element 3 to the circuit board 6.

The plating layer 233 has a laminated structure of an Ni film 261, a Pd film 262 and an Au film 263. The laminated structure of the plating layer 233 is formed of material that is the same as respective material of the first and second conductors 241 and 242 and the terminal sections 25 and has thickness that is the same as respective thickness thereof. The interposer 2a accordingly enables forming the first and second conductors 241 and 242, the terminal sections 25 and the plating layer 233 at the same time in production thereof. The Ni film 261, the Pd film 262 and the Au film 263 in the plating layer 233 are arranged in that order from a side of the surface of the aluminum film 232.

Hereinafter, one example of an interposer (2a) production method will be explained with reference to FIGS. 3A, 3B, 4A, 4B, 5A, 5B, 6A, 6B, 7A and 7B.

In the interposer (2a) production method, first a silicon wafer 200 to be formed as silicon substrate 20 is prepared (see FIG. 3A), and subsequently first to tenth processes below are sequentially performed.

In the interposer (2a) production method, the structure shown in FIG. 3B is acquired by performing the first process.

The first process includes, by a thermal oxidation method, forming the silicon oxide film 21 on a side of a surface of the silicon wafer 200 and also forming the silicon oxide film 231 on a side of a back surface of the silicon wafer 200. With the interposer (2a) production method, the surface of the silicon wafer 200 after the end of the first process corresponds to the surface of the silicon substrate 20, while the back surface of the silicon wafer 200 after the end of the first process corresponds to the back surface of the silicon substrate 20.

In the interposer (2a) production method, the structure shown in FIG. 4A is acquired by performing the second process.

The second process includes first and second steps to be performed sequentially. The first step includes forming the aluminum film 232 on the silicon oxide film 231 through a sputtering or evaporation method. The second step includes forming the aluminum film 232 on the silicon oxide film 21 through a sputtering or evaporation method, and then forming the aluminum film 22 having the predetermined pattern by patterning the aluminum film through photolithography and etching technique. Note that at an end stage of the second process, the aluminum film 22 having the predetermined pattern is also formed on a region corresponding to the outer peripheral edge of the surface of the silicon oxide film 21 in the interposer 2a. The aluminum film 22 having the predetermined pattern is formed up to the outer peripheral edge of the silicon wafer 200.

In the interposer (2a) production method, the structure shown in FIG. 4B is acquired by performing the third process.

The third process includes forming a silicon oxide film to be formed as the protective film 29 through a plasma CVD method, and then forming the protective film 29 by patterning the silicon oxide film through photolithography and etching technique. The protective film 29 is formed by patterning so as to expose respective predetermined regions of the surface of the aluminum film 22 having the predetermined pattern, on which the element mounting sections 24 and the terminal sections 25 are to be formed.

In the interposer (2a) production method, the structure shown in FIG. 5A is acquired by performing the fourth process.

The fourth process includes the zincate treatment. The fourth process accordingly includes forming zinc substitution films 221 in respective regions of the surface of the aluminum film 22 having the predetermined pattern, to be formed with the element mounting sections 24 and the terminal sections 25, and also forming a zinc substitution film 2321 on the surface of the aluminum film 232.

In the interposer (2a) production method, the structure shown in FIG. 5B is acquired by performing the fifth process.

The fifth process includes, by electroless plating, forming the element mounting sections 24 (first and second conductors 241 and 242) and the terminal sections 25 on the aluminum film 22 having the predetermined pattern, and also forming the plating layer 233 on the aluminum film 232.

In the interposer (2a) production method, the structure shown in FIG. 6A is acquired by performing the sixth process.

The sixth process includes forming, on the side of the surface of the silicon wafer 200, a resist layer 270 obtained by patterning so as to expose respective predetermined regions to be formed with the first and second conductors 241 and 242 through a photolithography technique. The resist layer 270 is preferably formed of positive-type photoresist.

In the interposer (2a) production method, the structure shown in FIG. 6B is acquired by performing the seventh process.

The seventh process includes forming the Pt layers 26, the AuSn layers 27 and the Au layers 28 by electroplating. That is, the laminated structure of the Pt layer 26, the AuSn layer 27 and the Au layer 28 is formed on each of the predetermined regions of the first and second conductors 241 and 242.

Figures 7A, 7B:
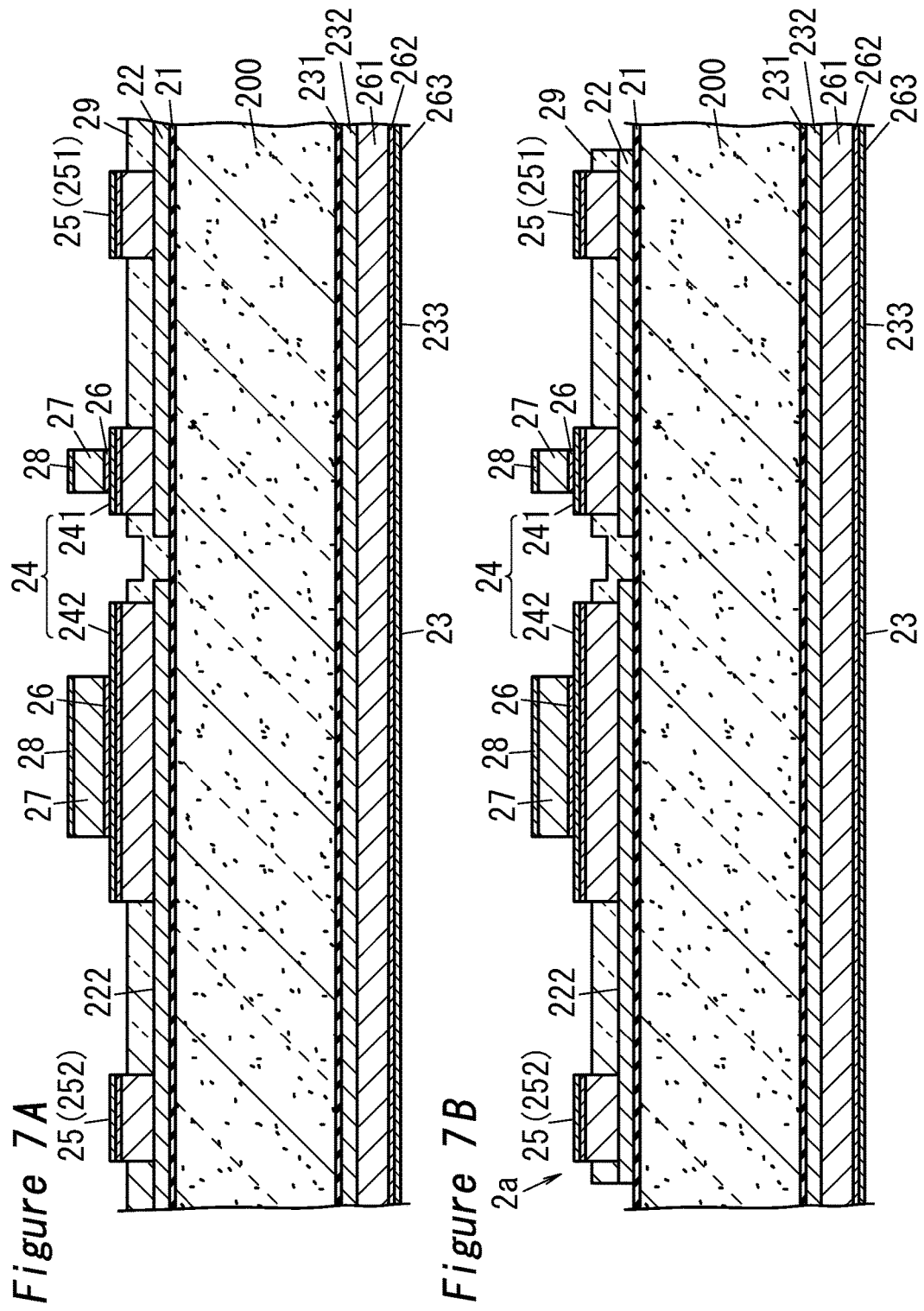
FIGS. 7A and 7B are sectional views of illustrating processes in the interposer production method.

In the interposer (2a) production method, the structure shown in FIG. 7A is acquired by performing the eighth process.

The eighth process includes removing (peeling) the resist layer 270. In order to remove the resist layer 270, it includes, for example, removing the resist layer 270 by organic solvent (acetone) following $O_2$ plasma ashing. In the interposer (2a) production method according to the embodiment, the resist layer 270 is formed of positive-type photoresist, and it is accordingly possible to remove the resist layer with the organic solvent without using acid-based chemical liquid when removing the resist layer 270 and to suppress the degradation of a base of the resist layer 270.

In the interposer (2a) production method, the structure shown in FIG. 7B is acquired by performing the ninth process.

The ninth process includes removing, through photolithography and etching technique, parts of the protective film 29 and the aluminum film 22 having the predetermined pattern, formed on a region corresponding to the outer peripheral edge of the surface of the outer peripheral edge 21 in the interposer 2a. With the interposer (2a) production method, the wafer which interposers 2a are mounted on has been finished at the end of the ninth process.

In the interposer (2a) production method, the interposer 2a shown in FIG. 1 is acquired by performing the tenth process.

The tenth process includes dividing the wafer into individual interposers 2a with a dicing saw.

The interposer (2a) production method as explained above enables achieving cost reduction in the interposers 2a.

An LED module (10a) production method includes mounting the light emitting element 3 on the interposer 2a, connecting the interposer 2a to the circuit board 6 by die bonding, and subsequently electrically connecting the interposer 2a and the circuit board 6 by wire bonding.

Figure 8:
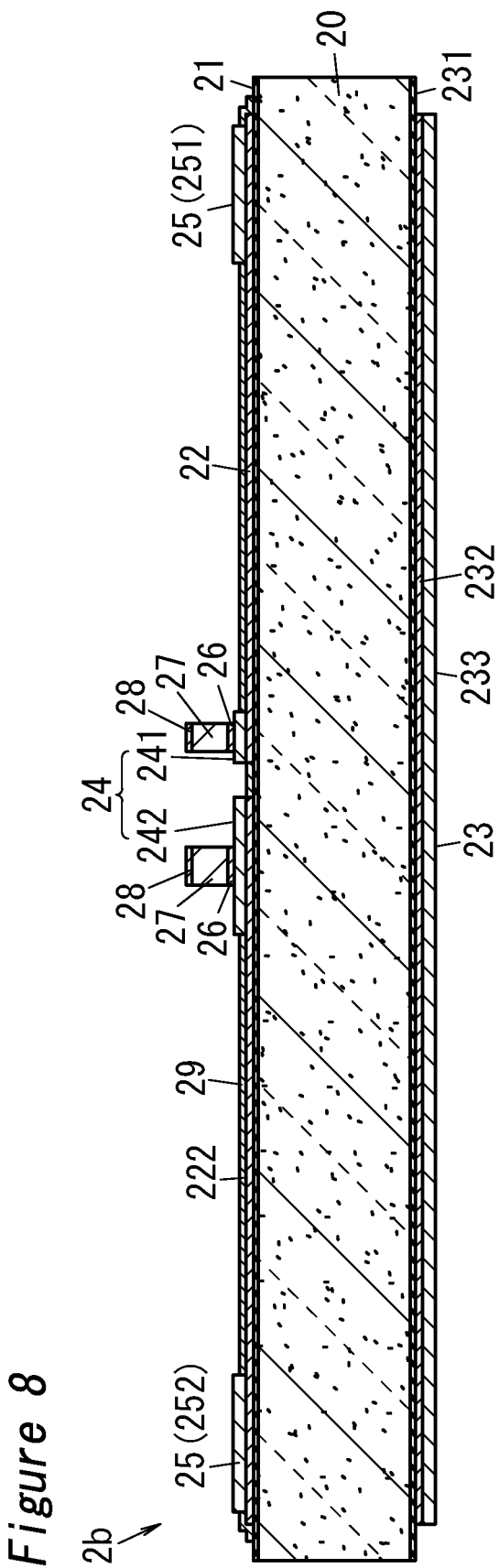
FIG. 8 is a schematic sectional view of an interposer of Modified Example 1 in Embodiment 1 of the present invention.

FIG. 8 is a schematic sectional view of an interposer 2b of Modified Example 1 in Embodiment 1. The interposer 2b of Modified Example 1 is configured like the interposer 2a and differs therefrom in that a laminated film of a silicon oxide film 231 and an aluminum film 232 on a back surface of a silicon substrate 20 is formed apart from an outer peripheral edge of the back surface of the silicon substrate 20. The interposer 2b also differs therefrom in that on an outer peripheral edge of a silicon oxide film 21, a protective film 29 covers side edges of an aluminum film 22 having a predetermined pattern. The interposer 2b accordingly enables improving reliability. In the interposer 2b, like kind components are assigned the same reference numerals as depicted in the interposer 2a, and the explanation thereof is not described.

An interposer (2b) production method in Modified Example 1 is similar to the interposer (2a) production method, and merely includes one additional process that includes patterning a laminated film of the silicon oxide film 231 and the aluminum film 232 on the back surface of the silicon substrate 20.

The interposer 2b enables preventing the aluminum film 232 from being pulled by a dicing saw to touch the silicon substrate 20 when diced in production thereof, thereby improving the manufacturing yield. Preferably, a distance from the outer peripheral edge of the silicon oxide film 21 to the aluminum film 22 having the predetermined pattern in the surface of the silicon oxide film 21 is, for example 0.05 mm to 1 mm.

Figure 9:
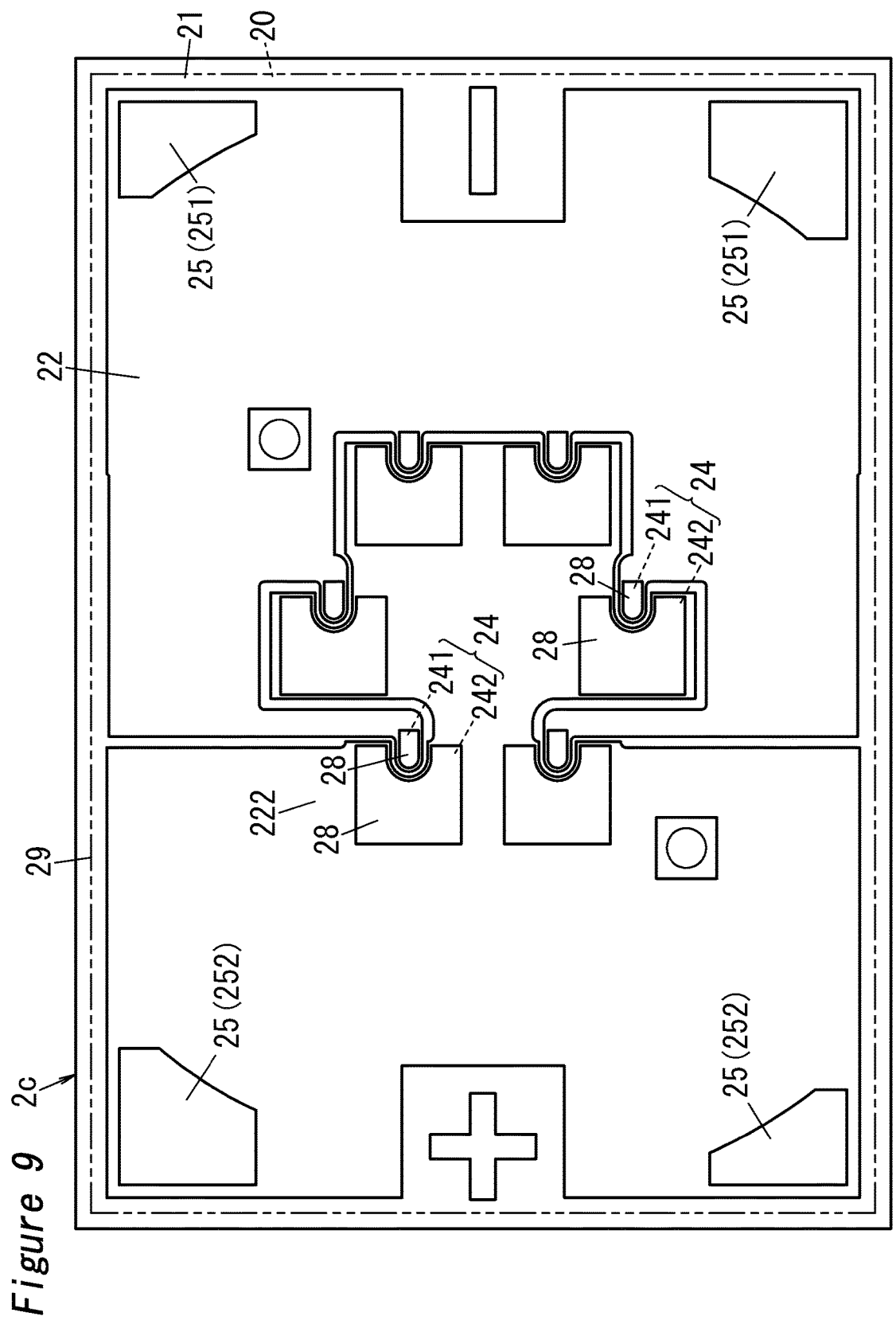
FIG. 9 is a schematic plan view of an interposer of Modified Example 2 in Embodiment 1 of the present invention.

FIG. 9 is a schematic plan view of an interposer 2c of Modified Example 2. The interposer 2c of Modified Example 2 differs from the interposer 2b of Modified Example 1 in that the interposer 2c is configured to allow a plurality of (six) light emitting elements 3 to be mounted on. In the interposer 2c, like kind components are assigned the same reference numerals as depicted in the interposer 2b, and the explanation thereof is not described.

The interposer 2c includes six pairs of element mounting sections 24 that allows the six light emitting elements 3 to be mounted on. An aluminum film 22 having a predetermined pattern in the interposer 2c is formed so that the six light emitting elements 3 are connected in parallel. In the interposer 2c, each of predetermined regions of surfaces (here, whole regions of surfaces) of Au films 263 (see FIG. 1) in the element mounting sections 24 is formed with an AuSn layer 27.

Embodiment 2

Figure 10:
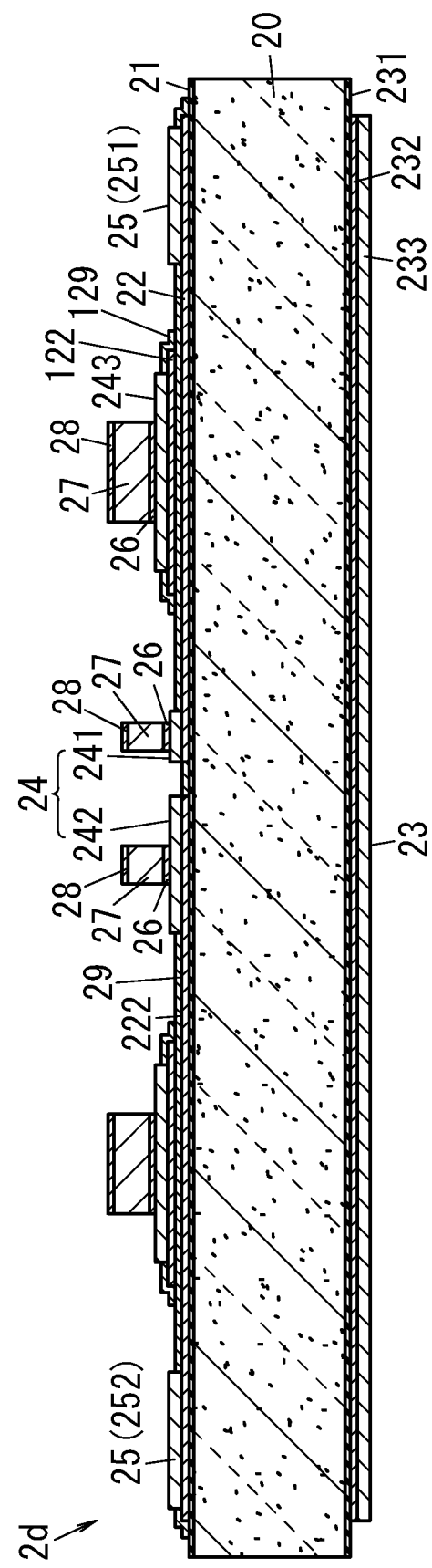
FIG. 10 is a schematic sectional view of an interposer in accordance with Embodiment 2 of the present invention.

Hereinafter, an interposer 2d according to the present embodiment will be explained with reference to FIGS. 10 and 11. The interposer 2d differs from the interposer 2b of Modified Example 1 in Embodiment 1 in that the interposer 2d includes a metal bonding layer 243 for joining a cap 7 (see FIG. 11) for covering a light emitting element 3 thereto. In the interposer 2d, like kind components are assigned the same reference numerals as depicted in the interposer 2b, and the explanation thereof is not described.

The interposer 2d is formed with a frame-shaped aluminum film 122 as a base of the metal bonding layer 243 on a protective film 29 (hereinafter also referred to as a "first protective film 29"). The frame-shaped aluminum film 122 is directly formed on the first protective film 29 so as to surround the element mounting sections 24 in a plan view. The frame-shaped aluminum film 122 is in the shape of, for example a rectangular frame. The "in a plan view" means to be seen along a thickness direction of the interposer 2d. The frame-shaped aluminum film 122 is arranged between the element mounting sections 24 and the terminal sections 25 in a plan view.

The metal bonding layer 243 has a frame shape in a plan view (is rectangular in shape as an example). The frame shape of the metal bonding layer 243 is narrower in width than the frame-shaped aluminum film 122. The metal bonding layer 243 is directly formed on the frame-shaped aluminum film 122.

The interposer 2d includes a protective film 129 (hereinafter also referred to as a "second protective film 129") that directly covers a region of a surface of the frame-shaped aluminum film 122, out of contact with the metal bonding layer 243. The second protective film 129 is preferably made of silicon oxide like the first protective film 29.

The metal bonding layer 243 is made of material that is the same as respective material of the element mounting sections 24 and the terminal sections 25, and has a laminated structure that is identical thereto. That is, the laminated structure of the metal bonding layer 243 in the interposer 2d is the same as that of each of first and second conductors 241 and 242 and the terminal sections 25. The interposer 2d accordingly enables forming the first and second conductors 241 and 242, the terminal sections 25 and the metal bonding layer 243 at the same time in production thereof.

The interposer 2d is formed with a laminated film of a Pt layer 26, an AuSn layer 27 and an Au layer 28 on a predetermined region of a surface of the metal bonding layer 243. The Pt layer 26, the AuSn layer 27 and the Au layer 28 are arranged in that order from a side of the surface of the frame-shaped aluminum film 122.

As explained above, the interposer 2d enables joining the cap 7 to the metal bonding layer 243 through the AuSn.

Hereinafter, a light emitting device 1d including the interposer 2d will be explained with reference to FIG. 11 before describing the interposer 2d in detail. In the light emitting device 1d, like kind components are assigned the same reference numerals as depicted in the light emitting device 1a explained in Embodiment 1 (see FIG. 2), and the explanation thereof is not described.

The cap 7 is smaller than the interposer 2d in a plan view. The cap 7 includes a spacer 4 and a cover 5. The spacer 4 is disposed on the interposer 2d. The spacer 4 is formed with a through hole 41 that exposes the light emitting element 3. The cover 5 is disposed on the spacer 4 to close the through hole 41 of the spacer 4.

The first and second conductors 241 and 242 in the interposer 2d are arranged to be exposed by the through hole 41 on a side of a surface of the silicon substrate 20.

The spacer 4 includes a spacer body 40 made of Si, and a metal bonding layer 43 that is disposed on a facing surface of the spacer body 40, which faces the interposer 2d so as to face the metal bonding layer 243. The spacer body 40 is formed of a single crystal silicon substrate whose surface is a (100) plane.

The spacer 4 has a height that is greater than thickness of the light emitting element 3. The light emitting device 1d accordingly enables preventing the light emitting element 3 from touching the cover 5. The spacer 4 is rectangular in outline shape in a plan view.

The through hole 41 is formed in the spacer body 40. The through hole 41 has an opening area that gradually increases as it goes away from the interposer 2d. That is, the opening area of the through hole 41 in the spacer 4 gradually increases as it goes away from the interposer 2d in a thickness direction of the interposer 2d. The light emitting device 1d accordingly enables the spacer 4 to function as a reflector for reflecting, toward the cover 5, ultraviolet radiation emitted sideways from the light emitting element 3. For example, the single crystal silicon substrate 400 has reflectivity that is higher than 70% with respect to ultraviolet radiation whose wavelength is 260 nm to 280 nm when an incidence angle thereof is 5° to 55°. The spacer 4 accordingly enables constituting the reflector having a comparatively high reflectivity without forming any reflection film such as an Al film on inner side faces of the through hole 41. The light emitting device 1d accordingly enables achieving cost reduction and increasing light output.

The through hole 41 of the spacer 4 is an inverted truncated square pyramid shaped hole. Specifically, each of the inner side faces of the through hole 41 in the spacer 4 is a face along a {111} plane. The through hole 41 can be formed by crystal anisotropic etching. Each of the inner side faces of the through hole 41 in the spacer 4 may be composed of a surface of a silicon oxide film formed along a {111} plane.

The spacer 4 is formed with a silicon oxide film 44 between the metal bonding layer 43 and the facing surface of the spacer body 40, which faces the interposer 2d. The metal bonding layer 43 is composed of, for example, a base film 431 and a laminated film 432, a top film of which is an Au film. Examples of material of the base film 431 include Al and the like.

The cover 5 is composed of glass that allows ultraviolet radiation emitted from the light emitting element 3 to pass through. In the light emitting device 1d, the spacer 4 is joined to the cover 5. The grass of the cover 5 in the light emitting device 1d contains alkaline component, and the spacer 4 is directly joined to the cover 5. Examples of the alkaline component include Na, K, Na$_2$O, K$_2$O and the like. The "is directly joined to" means it is joined without jointing (bonding) material or the like.

The glass of the cover 5 has transmittance with respect to the ultraviolet radiation emitted from the light emitting element 3, which is preferably greater than or equal to 70%, or more preferably greater than or equal to 80%. When the light emitting element 3 has a peak emission wavelength in a UV-C wavelength band, examples of the glass forming the cover 5 may include borosilicate glass and the like. The borosilicate glass contains alkaline component. Examples of the borosilicate glass may include 8347 and 8337B manufactured by SCHOTT Company.

The cap 7 in the light emitting device 1d is joined to the interposer 2d through a third joining part 63. The third joining part 63 is made of AuSn.

In the light emitting device 1d, the third joining part 63 is preferably formed along a whole outer peripheral edge of the facing surface of the spacer body 40, facing the interposer 2d. The light emitting device 1d accordingly enables preventing ambient air, moisture or the like from reaching the light emitting element 3, the first and second conductors 241 and 242, thereby improving reliability thereof.

The interposer 2d, the third joining part 63 and the cap 7 in the light emitting device 1d constitute a package that houses the light emitting element 3. The third joining part 63 in the light emitting device 1d is formed along the whole outer peripheral edge of the facing surface of the spacer body 40, facing the interposer 2d. The light emitting device 1d accordingly enables hermetic sealing of the light emitting element 3.

The light emitting device 1d preferably employs a space 8 enclosed with the interposer 2d, the third joining part 63 and the cap 7 as inert gas atmosphere. The light emitting device 1d accordingly enables suppressing oxidation of the light emitting element 3, the first and second conductors 241 and 242 and the like, thereby further improving the reliability.

The inert gas atmosphere is preferably N$_2$ gas atmosphere. Although the inert gas atmosphere preferably contains high purity of inert gas, 100% is not indispensable to the purity. For example, when N$_2$ gas is employed as the inert gas, the inert gas atmosphere may contain O$_2$ of about 100 to 200 ppm to be mixed unavoidably. The inert gas is not limited to N$_2$ gas, but examples thereof may further include Ar gas, mixed gas of N$_2$ gas and Ar gas, and the like.

A light emitting device (1d) production method will hereinafter be explained in brief.

The light emitting device (1d) production method includes preparing the light emitting element 3 and the cap 7, subsequently mounting the light emitting element 3 on the interposer 2d by sequentially performing first and second steps, and then joining the cap 7 to the interposer 2d by sequentially performing third and fourth steps. The light emitting device (1d) production method can accordingly obtain the light emitting device(s) 1d.

Bonding equipment is used at the first to fourth steps. Specifically, the first, second, third and fourth steps are performed in succession with a piece of bonding equipment. If the cap 7 is regarded as a die that is different in size from the light emitting element 3, the bonding equipment can be regarded as die bonding equipment and flip chip bonding equipment.

The bonding equipment includes, for example, a first suction holder, a second suction holder, a stage, a first heater, a second heater and a bonding chamber (a joining chamber).

The first suction holder is a first collet for suction-holding the light emitting element 3. The second suction holder is a second collet for suction-holding the cap 7. The interposer 2*d* is put on the stage. The first heater is provided in the stage and configured to heat the interposer 2*d*. The second heater is attached to a holder for alternatively holding either the first suction holder or the second suction holder, and configured to heat a die. In the bonding equipment, each of the first and second collets may include the second heater in place of the holder including the second heater. The die is the light emitting element 3 suction-held by the first suction holder or the cap 7 suction-held by the second suction holder. The stage is housed in the bonding chamber, in a processing chamber of which a process for joining the light emitting element 3 and the cap 7 to the interposer 2*d* on the stage is performed. Atmosphere in the bonding chamber is required to be appropriately adjusted according to predetermined atmosphere in the package. In the light emitting device (1*d*) production method, the atmosphere in the bonding chamber is $N_2$ gas atmosphere as one example. In the bonding equipment, an entrance of the bonding chamber is opened, and the interposer 2*d*, the first and second suction holders and the like are put therein or withdrawn therefrom through the entrance with $N_2$ gas supplied into the bonding chamber through the entrance from the outside of the bonding chamber. The bonding equipment accordingly enables cost reduction as compared with cases where the bonding equipment is configured so that the joining process is performed in a vacuum chamber.

Figure 12:
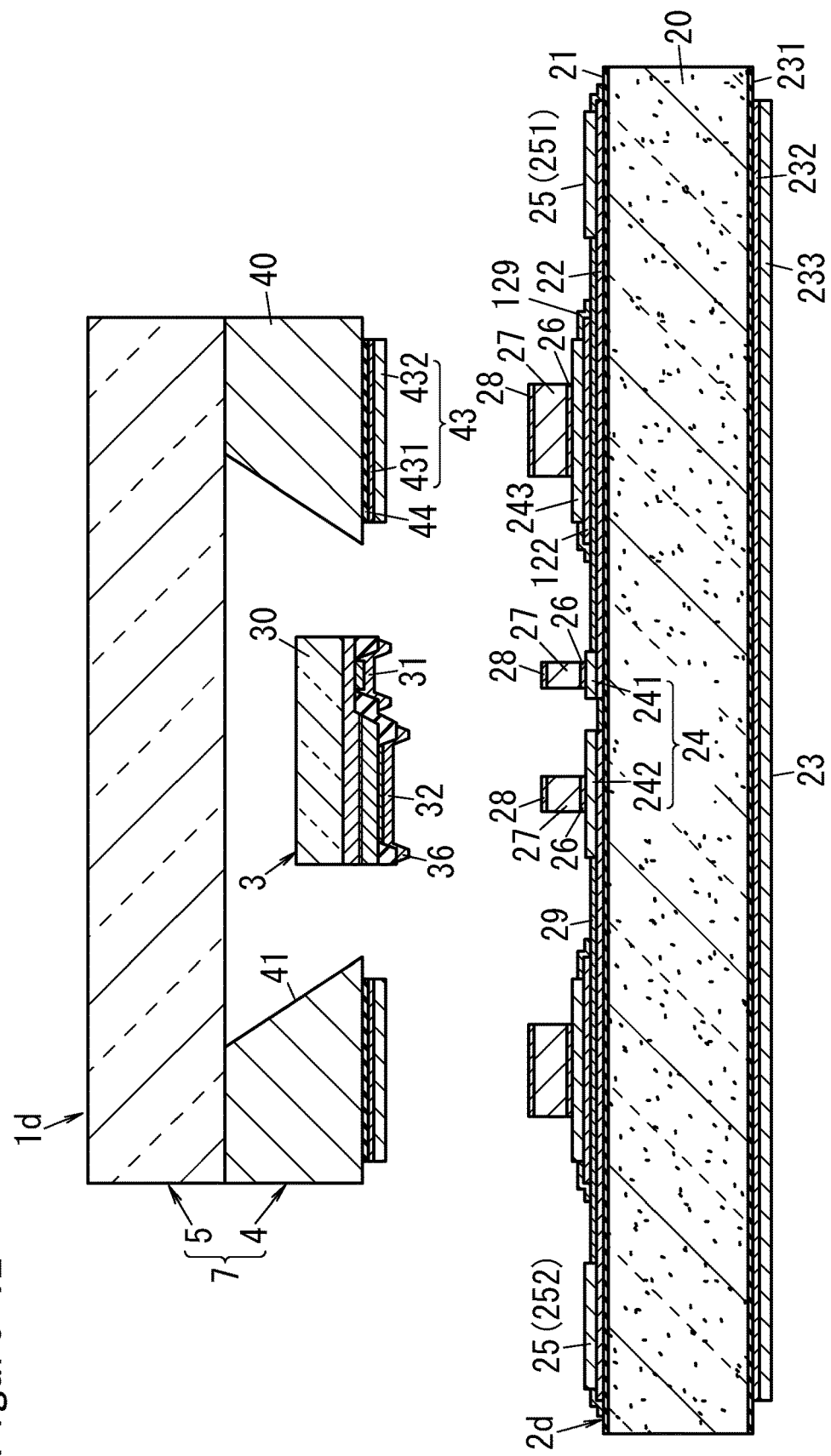
FIG. 12 is sectional views of illustrating a process in a production method of a light emitting device with the interposer.

The first step includes causing the light emitting element 3 to face the interposer 2*d* as shown in FIG. 12. The "causing the light emitting element 3 to face the interposer 2*d*" means causing the light emitting element 3 to face the interposer 2*d* so that first and second electrodes 31 and 32 of the light emitting element 3 face the first and second conductors 241 and 242 of the interposer 2*d*, respectively.

The first step includes causing the first and second electrodes 31 and 32 of the light emitting element 3 suction-held by the first suction holder to face the first and second conductors 241 and 242 of the interposer 2*d*. Specifically, the first step includes causing the first electrode 31 to face the Au layer 28 on a surface of the first conductor 241 and causing the second electrode 32 to face the Au layer 28 on a surface of the second conductor 242.

The second step includes joining the first and second electrodes 31 and 32 of the light emitting element 3 to the first and second conductors 241 and 242 of the interposer 2*d* through the AuSn layers 27 on the first and second conductors 241 and 242, respectively. The second step includes melting the AuSn layers 27 on the first and second conductors 241 and 242 while appropriately applying heating and pressure thereto with the light emitting element 3 laid on the interposer 2*d*. The AuSn layers 27 are melted and then Au diffuses in the melted AuSn from the Au layers 28 on the AuSn layers 27, thereby increasing a composition ratio of Au in the melted AuSn.

The second step includes melting the AuSn layers 27 on the first and second conductors 241 and 242 and then adding pressure from the side of the light emitting element 3 so that a projection structure 36 touches the second conductor 242. The second step accordingly includes filling AuSn into a space enclosed with the projection structure 36, the second conductor 242 and the second electrode 32 with the space spread sideways by pressing down the melted AuSn, and then cooling and solidifying the melted AuSn. The volume of the laminated film of the Pt layer 26, the AuSn layer 27 and the Au layer 28 on the second conductor 242 is preferably set to be equal to the capacity of the space so that the AuSn forming a second joining part 62 does not exit from the space.

The second step may include heating only the interposer 2*d* with the first heater or heating the light emitting element 3 with the second heater. Considering the joining performance between the interposer 2*d* and the light emitting element 3, it is preferable that the second step include heating with both the first and second heaters. The second step also includes applying pressure thereto by applying an appropriate load. Preferably, the load is set to be in a range of, for example about 0.1 to 1 $kg/cm^2$ per light emitting element 3. Time for applying the load is preferably to be set in a range of, for example about 0.1 to 1 second. The second step is preferably performed in $N_2$ gas atmosphere.

The third step includes causing the metal bonding layer 43 of the cap 7 suction-held by the second suction holder to face the metal bonding layer 243 of the interposer 2*d*. Specifically, the third step includes causing the metal bonding layer 43 to face the Au layer 28 on the surface of the metal bonding layer 243.

The fourth step includes joining the metal bonding layer 43 of the cap 7 to the metal bonding layer 243 of the interposer 2*d* through the AuSn layer 27 on the metal bonding layer 243.

The abovementioned fourth step includes melting the AuSn layer 27 while applying appropriate heating and pressure thereto with the metal bonding layer 43 of the cap 7 laid on the Au layer 28 on the surface of the metal bonding layer 243 in a contact state. With the fourth step, the AuSn layer 27 is melted and then Au diffuses in the melted AuSn from the Au layer 28 on the AuSn layer 27, thereby increasing a composition ratio of Au in the melted AuSn. The fourth step includes applying pressure to the AuSn layer 27 from a side of the cap 7 after melting the AuSn layer 27 and cooling and solidifying the melted AuSn with the melted AuSn spread sideways by pressing down the melted AuSn.

The forth step may include heating only the interposer 2*d* with the first heater or heating the cap 7 with the second heating. Considering the joining performance between the interposer 2*d* and the cap 7, it is preferable that the fourth step include heating with both the first and second heaters. The fourth step also includes applying pressure thereto by applying an appropriate load. Preferably, the load is set to be in a range of, for example about 0.1 to 1 $kg/cm^2$ per cap 7. Time for applying the load is preferably to be set in a range of, for example about 0.1 to 1 second. The fourth step is preferably performed in $N_2$ gas atmosphere.

Figure 11:
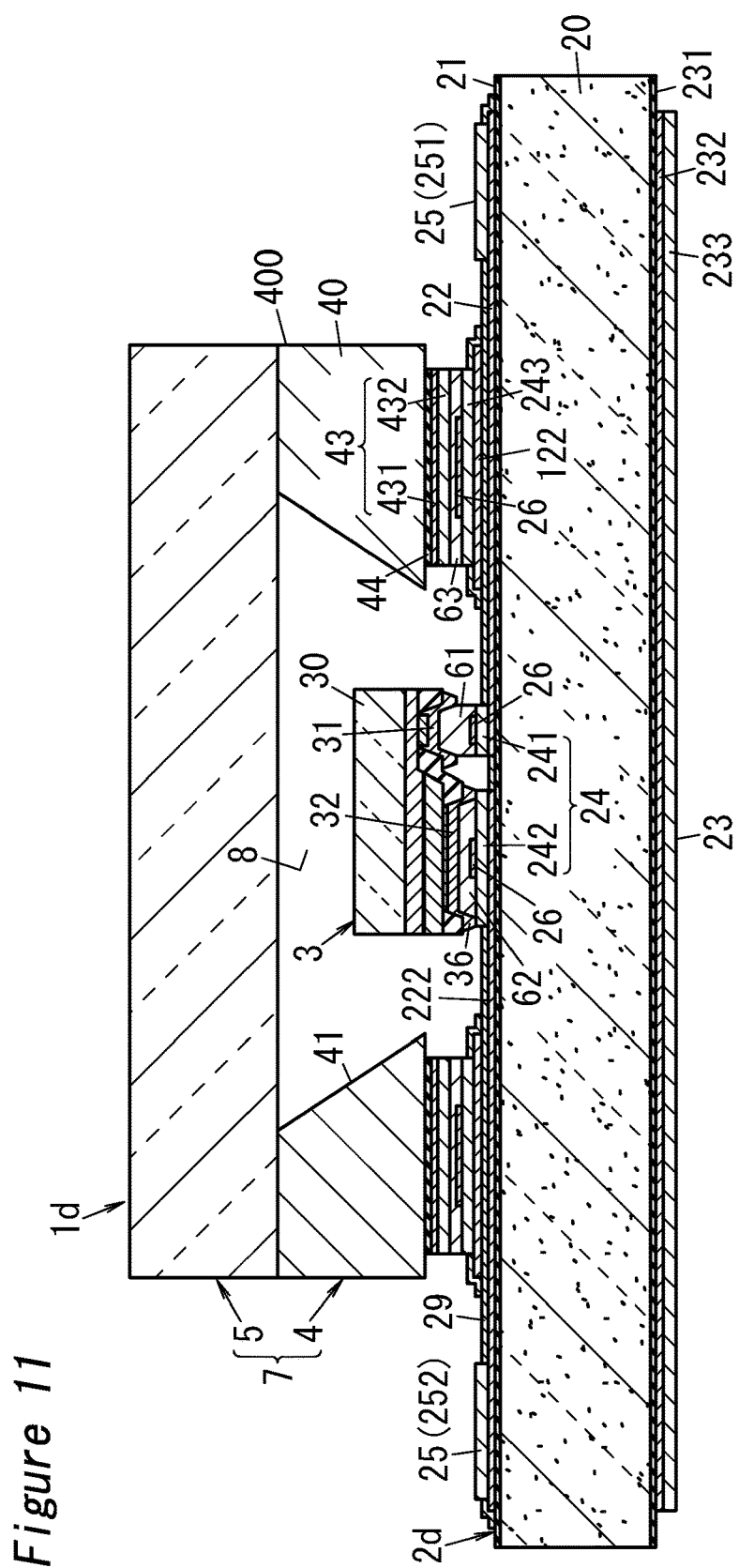
FIG. 11 is a schematic sectional view of a light emitting device with the interposer.

With light emitting device (1*d*) production method, the light emitting device 1*d* configured as shown in FIG. 11 can be obtained at the end of the fourth step. The light emitting device (1*d*) production method enables forming the first, second and third joining parts 61, 62 and 63 by using the AuSn layer 27 on the first conductor 241 of the interposer 2*d*, the AuSn layer 27 on the second conductor 242, and the AuSn layer 27 on the metal bonding layer 243, respectively. The light emitting device (1*d*) production method accordingly enables cost reduction.

In the interposer 2*d*, though the element mounting sections 24, terminal sections 25 and the metal bonding layer 243 are provided on a side of a surface of a silicon oxide film 21, the protective film 29 electrically insulates the metal bonding layer 243 from the element mounting sections 24 and the terminal sections 25.

The metal bonding layer 243 in the interposer 2*d* is apart from the element mounting sections 24 in a plan view. A reflecting surface 222 in the interposer 2*d* is accordingly formed by a region of a surface of an aluminum film 22 having a predetermined pattern, which is inside and away from the metal bonding layer 243 in a plan view and is not covered with the element mounting sections 24.

Figure 13:
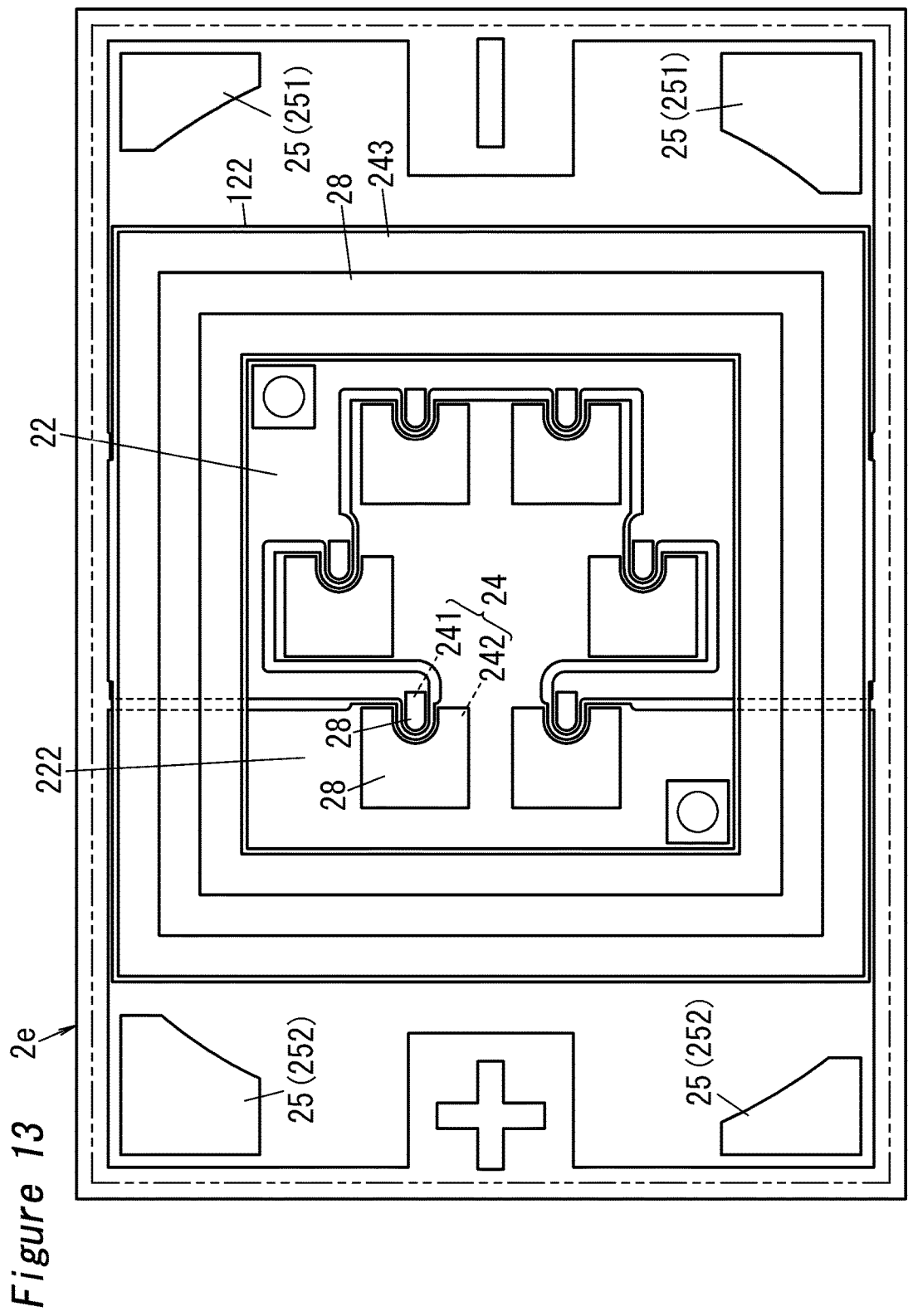
FIG. 13 is a schematic plan view of an interposer of a modified example in Embodiment 2.

FIG. 13 is a schematic plan view of an interposer 2e of a modified example in Embodiment 2. The interposer 2e of the modified example differs from the interposer 2d in that the interposer 2e is configured to allow a plurality of (six) light emitting elements 3 to be mounted on. In the interposer 2e, like kind components are assigned the same reference numerals as depicted in the interposer 2d, and the explanation thereof is not described.

The interposer 2e includes six pairs of element mounting sections 24 that allows the six light emitting elements 3 to be mounted on. An aluminum film 22 having a predetermined pattern in the interposer 2e is pattern-formed so that the six light emitting elements 3 are connected in parallel. In the interposer 2e, each of predetermined regions of surfaces (here, whole regions of surfaces) of Au films 263 (see FIG. 1) in the element mounting sections 24 is formed with an AuSn layer 27.

A metal bonding layer 243 is formed to have a size for surrounding the six pairs of element mounting sections 24. A reflecting surface 222 in the interposer 2d is formed of a region of a surface of the aluminum film 22 having the predetermined pattern, which is inside and away from the metal bonding layer 243 in a plan view and is not covered with the six pairs of element mounting sections 24.

Respective material and numerical values described in Embodiment 1, Modified Example 1 in Embodiment 1, Modified Example 2 in Embodiment 1, Embodiment 2 and the modified example in Embodiment 2 are merely shown as preferable examples, and not intended to be limited thereto. Appropriate modifications may further be added to the configuration within the scope not departing from technical ideas of the present invention.

For example, each of the element mounting sections 24 and the terminal sections 25 is not limited to having a laminated structure of an Ni film 261, a Pd film 262 and an Au film 263, but may have a laminated structure of an Ni film 261 and an Au film 263. Here, the Ni film 261 and the Au film 263 in each of the element mounting sections 24 and the terminal sections 25 are arranged in that order from a side of a surface of an aluminum film 22 having a predetermined pattern. Also in this case, the interposers 2a, 2b, 2c, 2d and 2e enable cost reduction. In this case, it is preferable that a plating layer 233 have a laminated structure of an Ni film 261 and an Au film 263.

An aluminum film 22 having a predetermined pattern in each of the interposers 2c and 2e is not limited to having a configuration that allows light emitting elements 3 to be connected in parallel, but may have a configuration allows light emitting elements 3 to be connected in series or a configuration allows light emitting elements 3 to be connected in series-parallel.

Material of an aluminum film 22 having a predetermined pattern is not limited to Al, but examples thereof may further include AlSi, AlSiCu, AlCu, AlSb, AlTiCu and the like.

A light emitting element(s) 3 is(are) not limited to a ultraviolet LED chip(s), but examples thereof may further include a visible light LED chip(s), a ultraviolet LD (laser diode) chip(s), a visible light LD chip(s) and the like.

A circuit board 6 may be a printed wiring board except for a metal-based printed wiring board.

REFERENCE SIGNS LIST 2a, 2b, 2c, 2d, 2e Interposer
3 Light emitting element
6 Circuit board
20 Silicon substrate
21 Silicon oxide film
22 Aluminum film having a predetermined pattern
222 Reflecting surface
23 Fixed portion
231 Silicon oxide film
232 Aluminum film
233 Plating layer
24 Element mounting section
25 Terminal section
26 Pt layer
27 AuSn layer
28 Au layer
29 Protective film (First protective film)
122 Frame-shaped aluminum film
129 Second protective film
243 Metal bonding layer
261 Ni film
262 Pd film
263 Au film

The invention claimed is:

1. An interposer, comprising
a silicon substrate,
a silicon oxide film that is directly formed on a surface of the silicon substrate,
an aluminum film having a predetermined pattern, which is directly formed on a surface of the silicon oxide film,
a fixed portion that is formed on a back surface of the silicon substrate in order to fix the silicon substrate to a circuit board,
element mounting sections for a light emitting element, the element mounting sections being directly and partly formed on a surface of the aluminum film having the predetermined pattern, and
terminal sections that are directly and partly formed on the surface of the aluminum film having the predetermined pattern, wherein
each of the element mounting sections and the terminal sections has a laminated structure of an Ni film, a Pd film and an Au film or a laminated structure of an Ni film and an Au film,
an AuSn layer is formed on a predetermined region of a surface of the Au film in each of the element mounting sections,
the surface of the aluminum film having the predetermined pattern forms, around each of the element mounting sections, a reflecting surface that reflects light, and
a protective film has optical permeability and directly covers a region of the surface of the aluminum film having the predetermined pattern, the region of the surface of the aluminum film being out of contact with the element mounting sections and the terminal sections.

2. The interposer of claim 1, where the protective film is made of silicon oxide.

3. The interposer of claim 2, further comprising a Pt layer between the AuSn layer and the predetermined region of the surface of the Au film in each of the element mounting sections.

4. The interposer of claim 2, comprising an Au layer that is directly formed on the AuSn layer.

5. The interposer of claim 2, wherein the aluminum film having the predetermined pattern is apart from an outer peripheral edge of the surface of the silicon oxide film.

6. The interposer of claim 2, wherein
the fixed portion has a silicon oxide film that is directly formed on the back surface of the silicon substrate, an aluminum film that is directly formed on a surface of the silicon oxide on the back surface of the silicon substrate, and a plating layer that is formed on a surface of the aluminum film of the fixed portion, and
the plating layer has a laminated structure that is the same as those of the element mounting sections and the terminal sections.

7. The interposer of claim 2, comprising
a frame-shaped aluminum film that is formed on the protective film as a first protective film, the frame-shaped aluminum film being directly formed on the first protective film so as to surround the element mounting sections in a plan view,
a metal bonding layer that is directly formed on the frame-shaped aluminum film, the metal bonding layer having a frame shape that is narrower in width than the frame-shaped aluminum film, and
a second protective film that directly covers a region of a surface of the frame-shaped aluminum film, which is out of contact with the metal bonding layer, wherein
the frame-shaped aluminum film is arranged between the element mounting sections and the terminal sections in a plan view,
the metal bonding layer is made of material that is the same as those of the element mounting sections and the terminal sections, the metal bonding layer having a laminated structure that is the same as those of the element mounting sections and the terminal sections, and
a laminated film of a Pt layer, an AuSn layer and an Au layer is formed on a predetermined region of a surface of the metal bonding layer.

8. The interposer of claim 1, further comprising a Pt layer between the AuSn layer and the predetermined region of the surface of the Au film in each of the element mounting sections.

9. The interposer of claim 8, comprising an Au layer that is directly formed on the AuSn layer.

10. The interposer of claim 8, wherein the aluminum film having the predetermined pattern is apart from an outer peripheral edge of the surface of the silicon oxide film.

11. The interposer of claim 8, wherein
the fixed portion has a silicon oxide film that is directly forming on the back surface of the silicon substrate, an aluminum film that is directly formed on a surface of the silicon oxide on the back surface of the silicon substrate, and a plating layer that is formed on a surface of the aluminum film of the fixed portion, and
the plating layer has a laminated structure that is the same as those of the element mounting sections and the terminal sections.

12. The interposer of claim 8, comprising
a frame-shaped aluminum film that is formed on the protective film as a first protective film, the frame-shaped aluminum film being directly formed on the first protective film so as to surround the element mounting sections in a plan view,
a metal bonding layer that is directly formed on the frame-shaped aluminum film, the metal bonding layer having a frame shape that is narrower in width than the frame-shaped aluminum film, and
a second protective film that directly covers a region of a surface of the frame-shaped aluminum film, which is out of contact with the metal bonding layer, wherein
the frame-shaped aluminum film is arranged between the element mounting sections and the terminal sections in a plan view,
the metal bonding layer is made of material that is the same as those of the element mounting sections and the terminal sections, the metal bonding layer having a laminated structure that is the same as those of the element mounting sections and the terminal sections, and
a laminated film of a Pt layer, an AuSn layer and an Au layer is formed on a predetermined region of a surface of the metal bonding layer.

13. The interposer of claim 1, comprising an Au layer that is directly formed on the AuSn layer.

14. The interposer of claim 1, wherein the aluminum film having the predetermined pattern is apart from an outer peripheral edge of the surface of the silicon oxide film.

15. The interposer of claim 1, wherein
the fixed portion has a silicon oxide film that is directly formed on the back surface of the silicon substrate, an aluminum film that is directly formed on a surface of the silicon oxide on the back surface of the silicon substrate, and a plating layer that is formed on a surface of the aluminum film of the fixed portion, and
the plating layer has a laminated structure that is the same as those of the element mounting sections and the terminal sections.

16. The interposer of claim 1, comprising
a frame-shaped aluminum film that is formed on the protective film as a first protective film, the frame-shaped aluminum film being directly formed on the first protective film so as to surround the element mounting sections in a plan view,
a metal bonding layer that is directly formed on the frame-shaped aluminum film, the metal bonding layer having a frame shape that is narrower in width than the frame-shaped aluminum film, and
a second protective film that directly covers a region of a surface of the frame-shaped aluminum film, which is out of contact with the metal bonding layer, wherein
the frame-shaped aluminum film is arranged between the element mounting sections and the terminal sections in a plan view,
the metal bonding layer is made of material that is the same as those of the element mounting sections and the terminal sections, the metal bonding layer having a laminated structure that is the same as those of the element mounting sections and the terminal sections, and
a laminated film of a Pt layer, an AuSn layer and an Au layer is formed on a predetermined region of a surface of the metal bonding layer.

* * * * *